(12) United States Patent
Asano et al.

(10) Patent No.: US 11,809,089 B2
(45) Date of Patent: Nov. 7, 2023

(54) CONTROL DEVICE, LITHOGRAPHY APPARATUS, MEASUREMENT APPARATUS, PROCESSING APPARATUS, PLANARIZING APPARATUS, AND ARTICLE MANUFACTURING METHOD

(71) Applicant: CANON KABUSHIKI KAISHA, Tokyo (JP)

(72) Inventors: Tosiya Asano, Utsunomiya (JP); Kota Nakano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/820,040

(22) Filed: Aug. 16, 2022

(65) Prior Publication Data

US 2022/0390856 A1 Dec. 8, 2022

Related U.S. Application Data

(63) Continuation of application No. 16/839,562, filed on Apr. 3, 2020, now Pat. No. 11,460,781, which is a
(Continued)

(30) Foreign Application Priority Data

Oct. 6, 2017 (JP) .................................. 2017-196419
Jul. 10, 2018 (JP) .................................. 2018-131013

(51) Int. Cl.
 *G05B 13/00* (2006.01)
 *G03F 7/00* (2006.01)
 *G05B 13/02* (2006.01)

(52) U.S. Cl.
 CPC ....... *G03F 7/70516* (2013.01); *G05B 13/021* (2013.01); *G05B 13/0265* (2013.01)

(58) Field of Classification Search
 CPC .............. G03F 7/70516; G05B 13/021; G05B 13/0265
 See application file for complete search history.

(56) References Cited

U.S. PATENT DOCUMENTS

2009/0222109 A1   9/2009 Takagi
2015/0192867 A1 * 7/2015 Imai .................... G03F 7/70641
                                                              355/55

FOREIGN PATENT DOCUMENTS

JP      H0470906 A      3/1992
JP      2003264134 A    9/2003

OTHER PUBLICATIONS

Anderson, Charles W., et al. "Robust reinforcement learning control using integral quadratic constraints for recurrent neural networks." IEEE Transactions on Neural Networks 18.4 (2007): 993-1002. (Year: 2007).*

* cited by examiner

*Primary Examiner* — Paul B Yanchus, III
(74) *Attorney, Agent, or Firm* — Canon U.S.A., Inc. IP Division

(57) ABSTRACT

A feedback control device that takes information regarding a control deviation between a measured value and a desired value of a controlled object as input, and outputs a manipulated variable for the controlled object, includes: a first control unit that takes information regarding the control deviation as input, and outputs a manipulated variable for the controlled object; a second control unit that takes information regarding the control deviation as input, and that includes a learning control unit in which a parameter for outputting a manipulated variable for the controlled object is determined by machine learning; and an adder that adds a first manipulated variable output from the first control unit and a second manipulated variable output from the second
(Continued)

control unit. A manipulated variable from the adder is output to the controlled object, and the second control unit includes a limiter that limits the second manipulated variable.

9 Claims, 5 Drawing Sheets

Related U.S. Application Data continuation of application No. PCT/JP2018/033854, filed on Sep. 12, 2018.

CONTROL DEVICE, LITHOGRAPHY APPARATUS, MEASUREMENT APPARATUS, PROCESSING APPARATUS, PLANARIZING APPARATUS, AND ARTICLE MANUFACTURING METHOD

CROSS-REFERENCE TO RELATED APPLICATIONS

This application is a Continuation of U.S. patent application Ser. No. 16/839,562, filed on Apr. 3, 2020, which is a Continuation of International Patent Application No. PCT/JP2018/033854, filed Sep. 12, 2018, which claims the benefit of Japanese Patent Application No. 2017-196419, filed Oct. 6, 2017, and No. 2018-131013, filed Jul. 10, 2018, all of which are hereby incorporated by reference herein in their entirety.

TECHNICAL FIELD

The present invention relates to a control device, a lithography apparatus, a measurement apparatus, a processing apparatus, a planarizing apparatus, and an article manufacturing method.

BACKGROUND ART

As control devices for controlling the physical variable of a target object, classic controllers such as those based on PID control are often used. In recent years, besides controllers based on classic control theories and controllers based on modern control theories, controllers configured using machine learning may also be used. In addition, controllers combining a controller not including machine learning and a controller based on machine learning may also be used. A positioning apparatus described in Japanese Patent Laid-Open No. 2017-102613 calculates the correction amount of a control command value by performing machine learning, and corrects a motor control command of a feedback control unit.

There is a problem related to the reliability of a control device using a controller based on machine learning. The possibility that a controller generated by machine learning outputs an abnormal control command for a situation that is greatly different from a situation given at the time of learning, that is, a situation that is greatly different from a group of situations given as learning data, may not be denied. This particularly causes a significant problem because it is difficult to grasp how a controller that contains a large-scale deep neural network where parameters are adjusted by machine learning responds (outputs) to input.

SUMMARY OF INVENTION

A feedback control device according to an aspect of the present invention for solving the above-described problems is a feedback control device that takes information regarding a control deviation between a measured value and a desired value of a controlled object as input, and outputs a manipulated variable for the controlled object, including: a first control unit that takes information regarding the control deviation as input, and outputs a manipulated variable for the controlled object; a second control unit that takes information regarding the control deviation as input, and that includes a learning control unit in which a parameter for outputting a manipulated variable for the controlled object is determined by machine learning; and an adder that adds a first manipulated variable output from the first control unit and a second manipulated variable output from the second control unit. A manipulated variable from the adder is output to the controlled object. The second control unit includes a limiter that limits the second manipulated variable output from the second control unit.

Further features of the present invention will become apparent from the following description of exemplary embodiments with reference to the attached drawings.

DESCRIPTION OF EMBODIMENTS

Hereinafter, preferred embodiments of the present invention will be described in detail on the basis of the accompanying drawings. Note that a controlled object to be described is not limited to each embodiment, and the type of controlled object is not limited as long as it is a physical variable usable in feedback control. Typical controlled objects are listed below. Exemplary controlled objects include the displacement, velocity, or acceleration in the straight and rotational directions of an object, and the flow rate, flow velocity, or pressure of gas or fluid. Other exemplary controlled objects include the liquid level of fluid, the temperature of an object, gas, or liquid, and the electric current, voltage, or charge of an electric circuit. Other exemplary controlled objects include a magnetic flux in a magnetic field, a magnetic flux density, or the sound pressure of a sound field. These physical variables are measured by sensing units using known sensors, and the measured value is input to a control device. A controlled variable drive unit is an active element that applies a change to the physical variable of the controlled object, and, when the controlled object is the position, velocity, or acceleration of an object, motors, piezo-elements, or the like are used. Pumps, valves, or the like are used for gas, fluid, or the like. A driver or the like that operates electric current or voltage is used for an electric system.

First Embodiment

Figure 1:
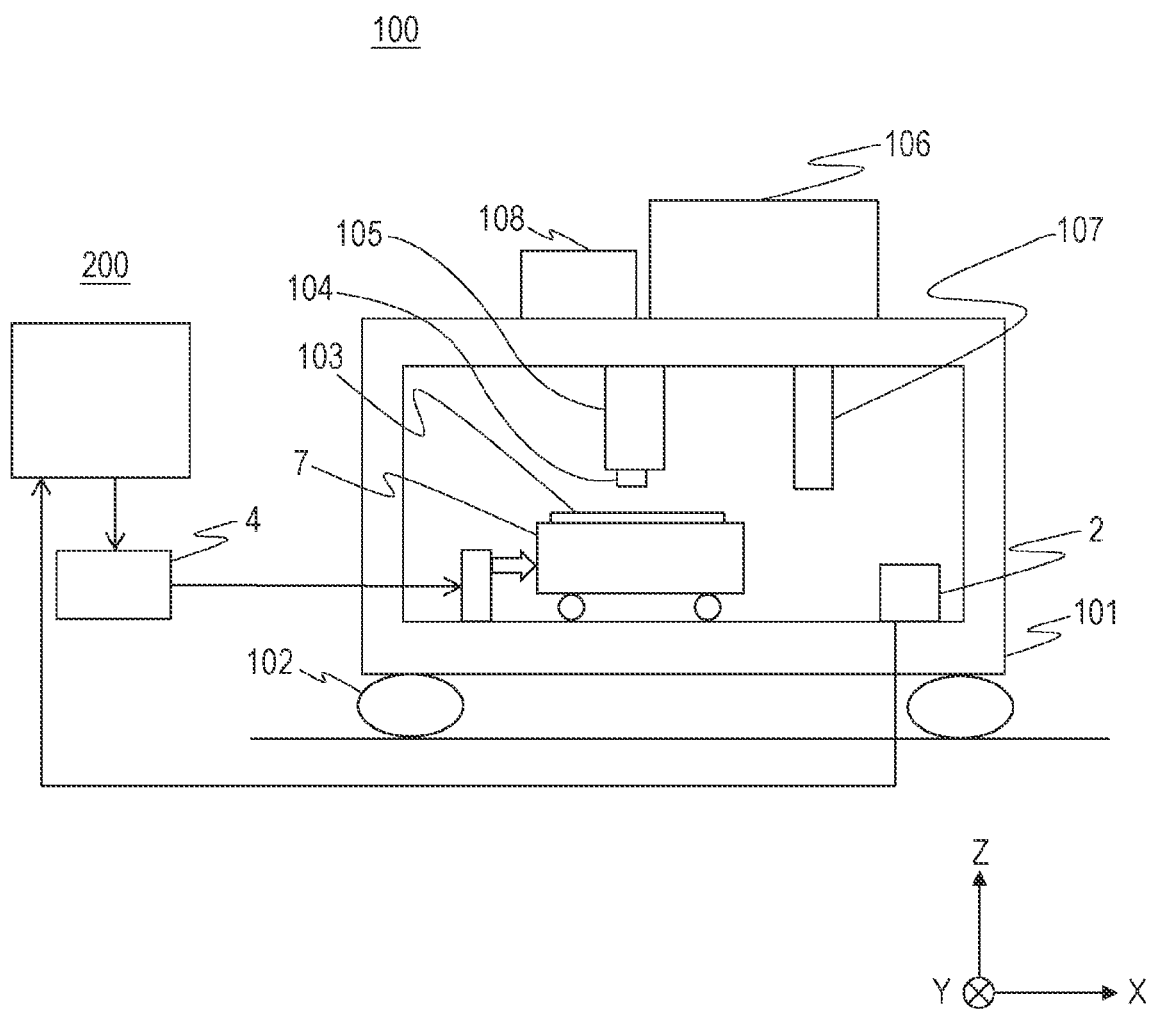
FIG. 1 is a schematic diagram illustrating an imprint apparatus according to a first embodiment.

In the present embodiment, an imprint apparatus will be described as an example of a lithography apparatus that forms a pattern on a substrate. FIG. 1 is a schematic diagram of the imprint apparatus. The imprint apparatus is an apparatus that includes a forming unit that forms a pattern of a cured product to which an uneven pattern of a mold is transferred, by bringing an imprinting material supplied onto a substrate into contact with the mold and applying curing energy to the imprinting material. For example, the imprint apparatus supplies an imprinting material onto a substrate, and cures the imprinting material in a state in which a mold where an uneven pattern is formed is in contact with the imprinting material on the substrate. By widening the distance between the mold and the substrate to peel off (release) the mold from the cured imprinting material, the imprint apparatus is able to transfer the pattern of the mold to the imprinting material on the substrate. Such a series of processes is referred to as an imprinting process, and is performed for each of a plurality of shot areas of the substrate. In short, in the case of performing an imprinting process for each of a plurality of shot areas of one substrate, the imprinting process is repeatedly performed for the number of shot areas of the substrate.

An imprint apparatus 100 includes a mechanical structure and a control system 200. A main body structure 101 of the imprint apparatus 100 is placed on the floor with a tripod or quadruped anti-vibration mechanism 102 using an air spring or the like. A wafer (substrate) 103 is held by a wafer stage (substrate stage) 7 with a wafer chuck (not illustrated). The wafer stage 7 moves the wafer 103 with sufficient X-directional and Y-directional strokes in order to perform an imprinting process on each shot area of the entire surface of the wafer 103. In addition, the wafer stage 7 has sufficient X-directional and Y-directional strokes for moving the wafer 103 to a replacement position for loading and unloading the wafer 103 with a wafer replacement hand (not illustrated).

Although the wafer stage 7 is simply illustrated as a box with wheels in FIG. 1, the wafer stage 7 is actually guided to move freely in the X-direction using static pressure guidance, and is given a driving force in the X-direction by a linear motor (drive unit). In addition, a Y stage (not illustrated) is movable in the Y-direction on the wafer stage 7 by static pressure guidance and the linear motor. The motor is driven by a drive circuit such as an electric current driver. A moving unit for moving a wafer which serves as a to-be-moved object includes a stage, a drive unit, and a drive circuit. Note that the configuration of the wafer stage 7 is not limited to this configuration, and a highly precise positioning stage used for a wafer stage of an exposure apparatus may be used.

The position in the X-direction of the wafer stage 7 is measured by a position measuring unit 2. The position measuring unit 2 includes a scale (not illustrated) configured on the main body structure 101, a head on the wafer stage 7, and a linear encoder of an arithmetic unit. Similarly, a Y-axis encoder (not illustrated) for measuring the Y-direction is also provided. To measure the position of the wafer stage 7, a combination of an interferometer provided on the main body structure 101 and a reflection mirror provided on the wafer stage 7 may be used.

A photo-curable resin serving as an imprinting material is supplied by a dispenser 107 to the position of a shot area of the wafer 103. At this time, the wafer stage 7 positions the resin coating position on the wafer directly below the dispenser 107. Next, the wafer stage 7 positions the resin coating position on the wafer directly below a mold 104 where a fine pattern is formed. The mold 104 is held by an imprinting head 105. The imprinting head 105 is structured to be capable of moving the mold 104 in the Z-direction. The mold 104 waits at a positron above the wafer 103 in the Z-direction until the position of the shot area of the wafer 103 moves to the mold 104. In response to positioning of the shot position of the wafer 103 directly below the mold 104, the mold 104 is lowered by the imprinting head 105 to press a pattern portion of the mold 104 against the resin. To manufacture a semiconductor device or the like using the imprint apparatus, alignment with the previous layer is important in transferring the pattern of the mold 104 to the resin on the wafer 103. An alignment detector 106 optically detects alignment marks (not illustrated) provided on both of the wafer 103 and the mold 104 to perform image processing, and detects misalignment of the alignment marks in the X- and Y-directions. This misalignment information is sent to the control system 200, which will be described later, and alignment is performed by correcting the X- and Y-positions of the wafer stage 7 or the imprinting head 105. In response to completion of the alignment, a lighting system 108 irradiates the resin with exposure light to cure the resin. After the resin is cured, the imprinting head 105 or the mold 104 is raised to release the mold 104 from the resin on the wafer 103. With this series of processes, a pattern corresponding to the pattern engraved in the mold 104 is transferred to the resin on the wafer 103. Similarly, imprinting processes are sequentially performed while changing the shot area position, and, in response to completion of the imprinting processes for all the shot areas of the wafer, the wafer stage 7 moves to the wafer replacement position. Then, the imprinted wafer is collected by the wafer replacement hand (not illustrated), and the next new wafer is supplied.

Figure 2:
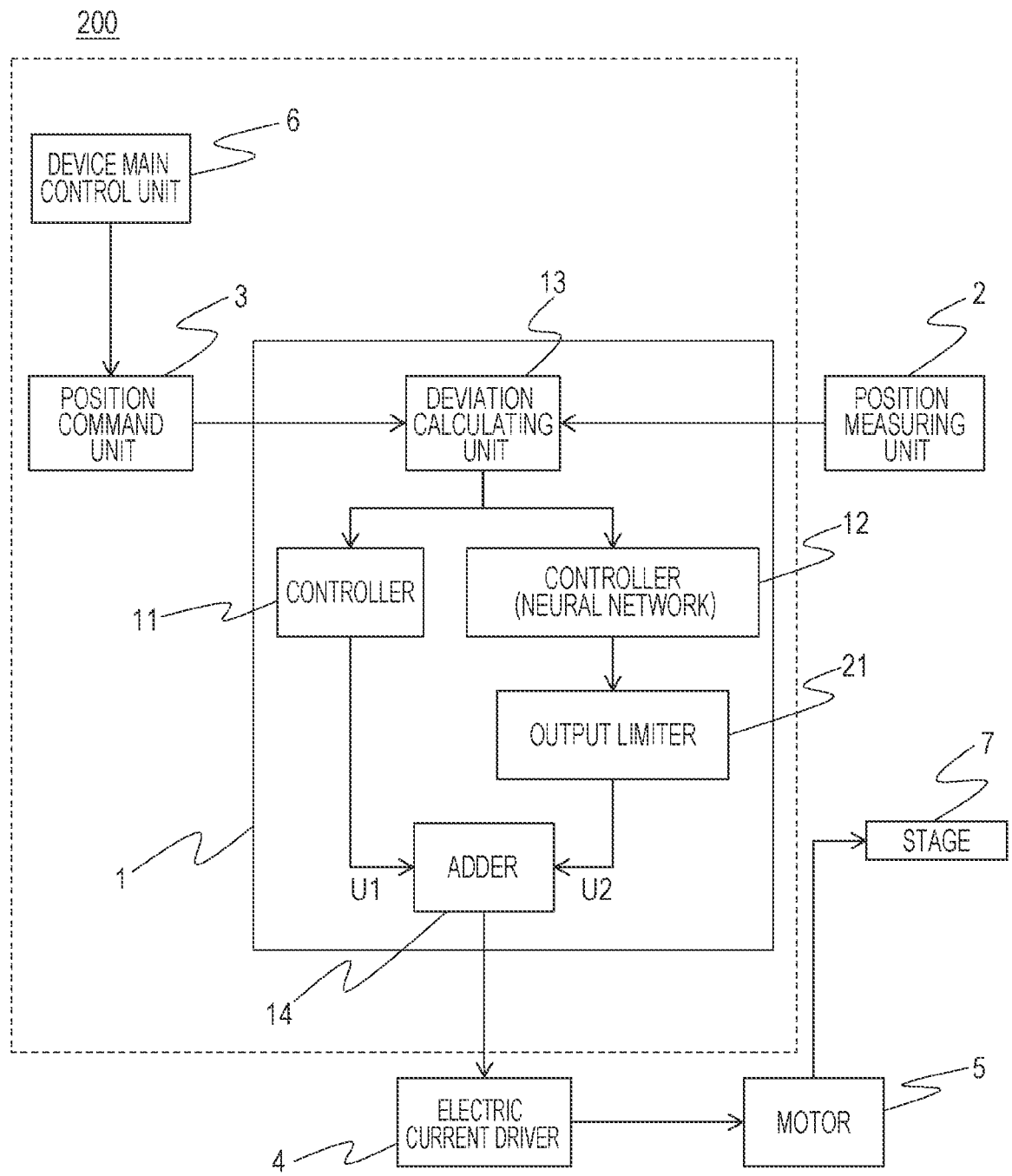
FIG. 2 is a schematic diagram of a control device according to the first embodiment.

FIG. 2 is a diagram illustrating the outline of the control system 200 (feedback control unit) according to the present embodiment. A portion inside a dotted line corresponds to the control system 200, and a digital calculator is used to perform complicated arithmetic operations. The control system 200 includes arithmetic processing units such as a CPU and an FPGA, and a storage device such as memory. A device main control unit 6 is a controller that controls the entire imprint apparatus, and has the role of sending commands to a control unit 1 and other control units (not illustrated) on the basis of sequence management of a job performed by the imprint apparatus.

A position command unit 3 obtains desired coordinates of a stage position from the device main control unit 6, stores the desired coordinates, and sends these values to the control unit 1. Misalignment information of alignment, which is obtained by the previously-described alignment detector 106, is also input to the position command unit 3 and is reflected in the desired coordinates of the wafer stage 7. The position measuring unit 2 measures the stage position at a predetermined time interval Δt, and sends the measured stage position to the control unit 1.

In the control unit 1, a deviation calculating unit 13 calculates the difference (a control deviation, hereinafter referred to as a stage deviation) between the stage position (measured values) sent from the position measuring unit 2 and desired values of the stage position sent from the position command unit 3, and sends the stage deviation to a controller 11 and a controller 12. The controller 11 (first control unit) uses a PID control system, and the controller 12 (learning control unit) includes a control system including a neural network. The controller 11 takes information regarding a stage deviation as input, and outputs a manipulated variable for the wafer stage 7. As for the output of the controller 12, the upper and lower limits of the output value are added by an output limiter 21 (controller). In short, the output limiter 21 limits the range of the manipulated variable that may be output from the second control unit. Note that the controller 12 may be configured to contain the output limiter 21. The illustration of the output limiter 21 is omitted in FIG. 3. A control unit including the controller 12 and the output limiter 21 serves as the second control unit. The second control unit takes information regarding a stage deviation as input, and a parameter for outputting the manipulated variable for the wafer stage 7 is determined by machine learning. An adder 14 outputs the sum (the result of addition) of an output value U1 (first manipulated variable) generated by the controller 11 (first control unit) and an output value U2 (second manipulated variable) which is generated by the controller 12 and limited by the output limiter 21.

Figure 3:
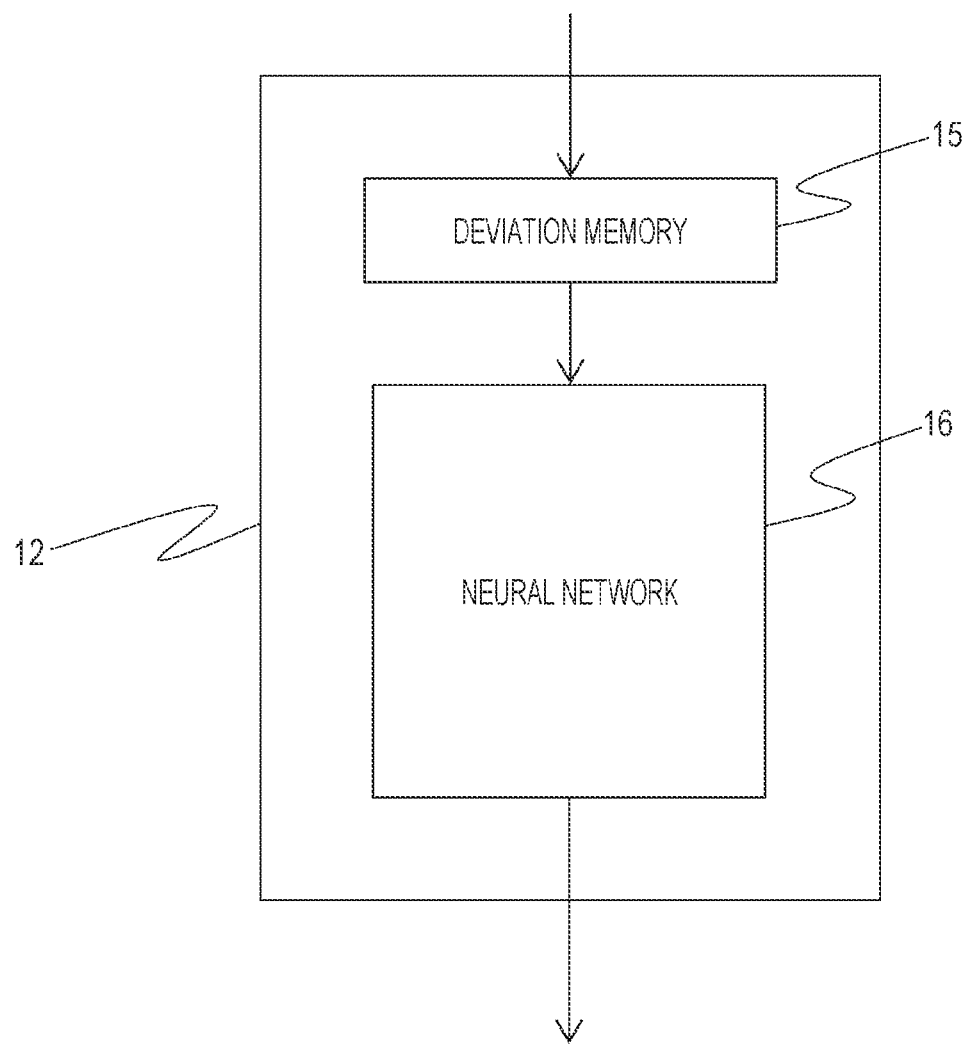
FIG. 3 is a diagram illustrating a learning control unit.

FIG. 3 illustrates the configuration of the controller 12. The controller 12 includes a deviation memory 15, which stores a stage deviation log, and a neural network 16. The deviation memory 15 saves a predetermined number (N, N is a natural number) of stage deviations, which correspond to the most recent N steps. As for the neural network 16, a parameter such as a network weight is adjusted such that, in response to inputting the stage deviations for the N steps, which are stored in the deviation memory 15, to the neural network 16, output layers output a value corresponding to a correction amount of a command value (output value) of the controller 11.

The network parameter of the neural network 16 in the controller 12 needs to be adjusted in advance in some way. Although a network parameter adjusting method based on reinforcement learning may be used as the adjustment method, the network parameter may be adjusted using any method. In addition, the neural network may be a network (policy network) that outputs one directly corresponding to the dimension of a command value, or a network (action value network) that calculates the value of a command value. In the case of an action value network, a selecting unit that selects an action with the maximum value is added after the neural network 16 in the controller 12, and a command value selected by the selecting unit serves as the output of the controller 12. In addition, the network parameter may be one that has been machine-learned in a state where the range of the second manipulated variable that may be output from the second control unit is limited by the output limiter 21.

A configuration using an output limiter may be, for example, one described below. That is, let the upper limit of the correction amount be Cmax, and the lower limit thereof be Cmin. Then, the number of output layers of the neural network 16 is set to D. After that, the k-th output value is set to output an action value of the correction value C=K* (Cmax−Cmin)/(D−1)+Cmin. In doing so, the (discrete) correction output value of the controller 12 may be limited to [Cmin, Cmax]. Furthermore, by setting the command range of the controller 11 to take a value that cancels out a correction value output from the controller 12, even if the controller 12 outputs an abnormal output, the controller 11 is able to suppress that command. The output value limiting method described here is only one example, and the output range of the controller 12 may be limited by various methods including other methods such as adding a limiter for continuous value outputs.

With the output limiter 21, the output range −U1 to U1 of the controller 11 and the output range −U2 to U2 of the controller 12 satisfy the relationship |U1|>|U2| (|U| indicates the absolute value of U). In short, the range of the second manipulated variable output from the second control unit is smaller than the range of the first manipulated variable output from the controller 11. Even if unexpected disturbance is applied to the neural network 16 and the output of the controller 12 diverges, its effect is within the range −U2 to U2. Because the controller 11 outputs the control command −U1 to U1 exceeding −U2 to U2, the effect of divergence of the controller 12 may be suppressed.

The output of the adder 14 goes through a D/A converter (not illustrated) to become an analog signal, which is then sent and input to an electric current driver 4. The electric current driver 4 applies control to allow the value of electric current flowing through a coil of a motor 5 to become the output of the adder 14. The thrust of the motor 5 is proportional to electric current flowing through the coil; thus, a force in accordance with the sum of the output values of the controller 11 and the controller 12 is applied to the wafer stage 7.

In the configuration of the control unit 1, the controller 11 mainly plays the role of a feedback control unit. The controller 12 using a neural network has the function of further suppressing a stage deviation that may not be compensated for by the controller 11. As a result, as compared with a control system including only the conventional controller 11, a stage deviation may be made very small, thereby improving the imprint apparatus's stage (substrate) alignment accuracy.

Like the control unit 1, as a result of the parallel use of a plurality of control systems taking a deviation as input, the control systems are likely to become unstable because of two factors, that is, the feedback gain becoming excessive and the outputs of the control systems acting as disturbances to each other. Therefore, generally, the physical variable serving as a controlled object is changed, and the configuration of multiple feedback loops having an inner loop and an outer loop is used. However, the stability of the control unit 1 is ensured in the present embodiment by causing the controller 12 using the output limiter 21 to function in a state where the stability of the controller 11 is ensured.

In addition, a control system using a conventional neural network has a configuration that takes not only a deviation, but also a position command and a control output as input. In this case, the neural network involves a great amount of computation, which makes it difficult, even with a digital calculator with high-performance arithmetic capability, to perform arithmetic operations within a certain period of time. In the present embodiment, the neural network in the controller 12 takes only a deviation as input, thus reducing the amount of computation and facilitating arithmetic operations to be performed within a certain period of time.

According to the present embodiment, reduction of the reliability of position control may be suppressed even when a controller generated by learning is used.

Second Embodiment

Figure 4:
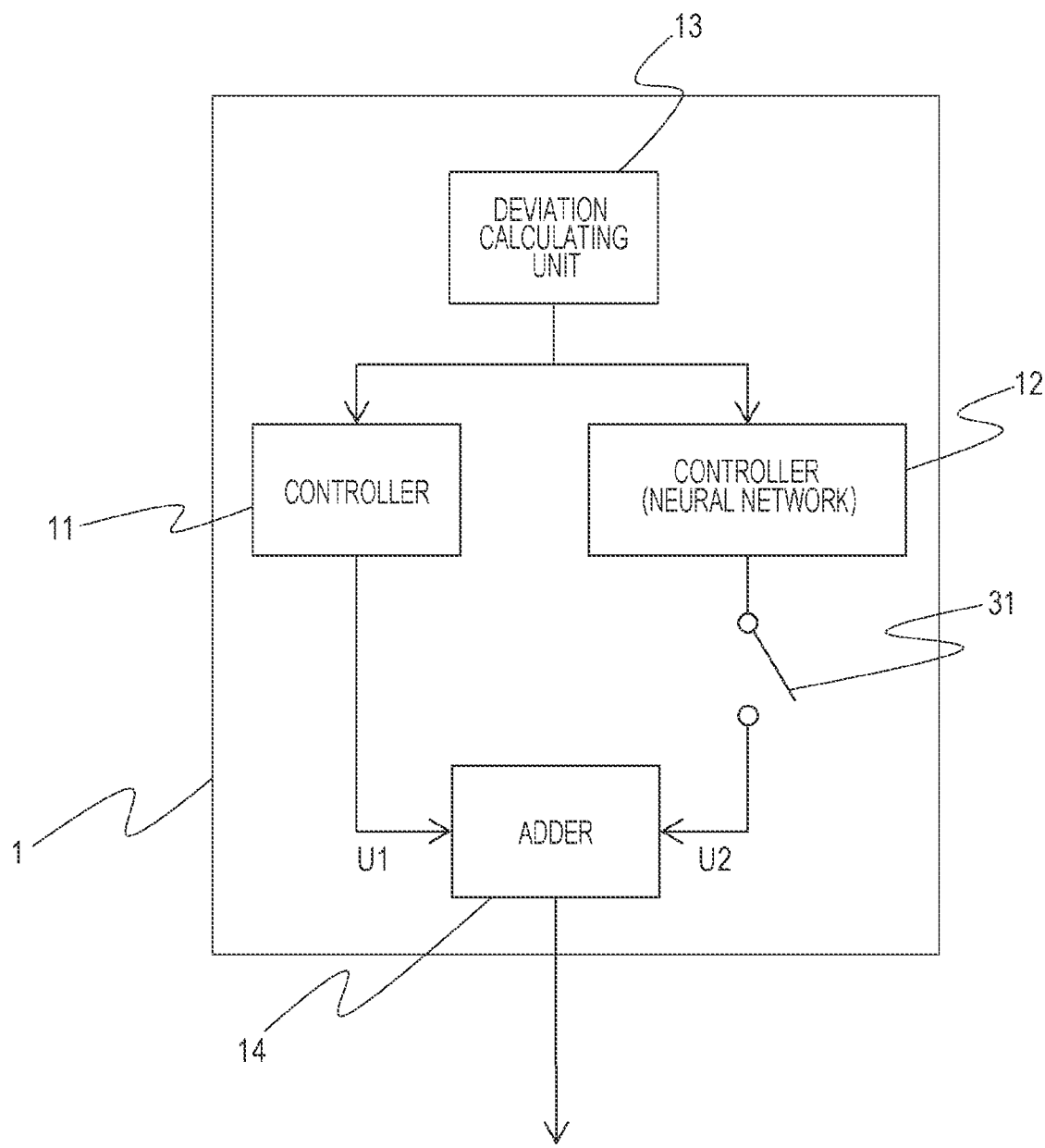
FIG. 4 is a schematic diagram of a control system according to a second embodiment.

Next, a second embodiment will be described using FIG. 4. FIG. 4 is a block diagram of the control unit 1. This control unit 1 is different from that of the first embodiment in the point that the output of the controller 12 is provided with an on/off switch 31. By turning off the on/off switch 31, the control unit 1 has the same configuration as a conventional control system; and, by turning on the on/off switch 31, the output of the controller 12 using the neural network functions. In short, the on/off switch 31 switches on/off the input of the second manipulated variable output from the second control unit to the moving unit.

Switching of the on/off switch 31 may be performed using a stage deviation calculated by the deviation calculating unit 13. In the case where the on/off switch 31 is on, the stage deviation should be smaller than that in the case where the on/off switch 31 is off; however, the case is conceivable in which the stage deviation becomes greater when, for example, unexpected disturbance is applied to the neural network in the controller 12. In this case, it is preferable to turn off the on/off switch 31, and then re-do the learning (machine learning) of the neural network.

Switching of the on/off switch 31 may be performed by defining a threshold and using software in a calculator. In addition, numerals and waveforms may be displayed on a display unit such as a display to enable the operator of the imprint apparatus to monitor the displayed numerals and waveforms, and the operator may manually switch on/off the switch with a selecting unit such as a user interface.

Switching of the on/off switch 31 may also be performed in accordance with the job sequence of the imprint apparatus. In the imprint apparatus, the magnitude and tolerance of a stage deviation vary according to the job sequence. A large stage deviation occurs when, for example, the wafer stage 7 is transferring a wafer or moves from immediately below the dispenser 107 to immediately below the mold 104; however, the magnitude of the stage deviation does not matter. Thus, the on/off switch 31 is turned off. A stage position deviation is directly linked to misalignment (pattern formation deviation) when aligning the mold 104 and the wafer 103. Thus, highly precise positioning is necessary, and the on/off switch 31 is turned on. As described here, the switch may be switched on/off according to the type of job performed on a wafer serving as a target.

For switching, a job sequence timing signal sent from the device main control unit 6 may be used. Switching may be performed by using the timing signal as it is, or switching may be performed with a certain amount of delay time after reception of the timing signal. In addition, switching may be performed on the basis of the timing signal and the magnitude of a stage deviation. For example, even if the timing signal indicates the end of driving, a large stage deviation may be left over immediately after the wafer stage 7 is positioned immediately below the mold 104. In this case, the on/off switch 31 is turned on at a time point at which the stage deviation becomes within certain values. Therefore, the control system 200 has a determination unit that determines whether the stage deviation is within a tolerance. In the case where it is determined that the deviation is not within the tolerance, the switch is turned off; and, in the case where it is determined that the deviation is within the tolerance, the switch is turned on.

Turning on the function of the controller 12 only in such situations where the stage deviation is relatively small is useful in the following two points: shortening the learning time of the neural network, and reducing the width of the output U2 of the controller 12 to enhance the stability of the control system.

Third Embodiment

Figure 5:
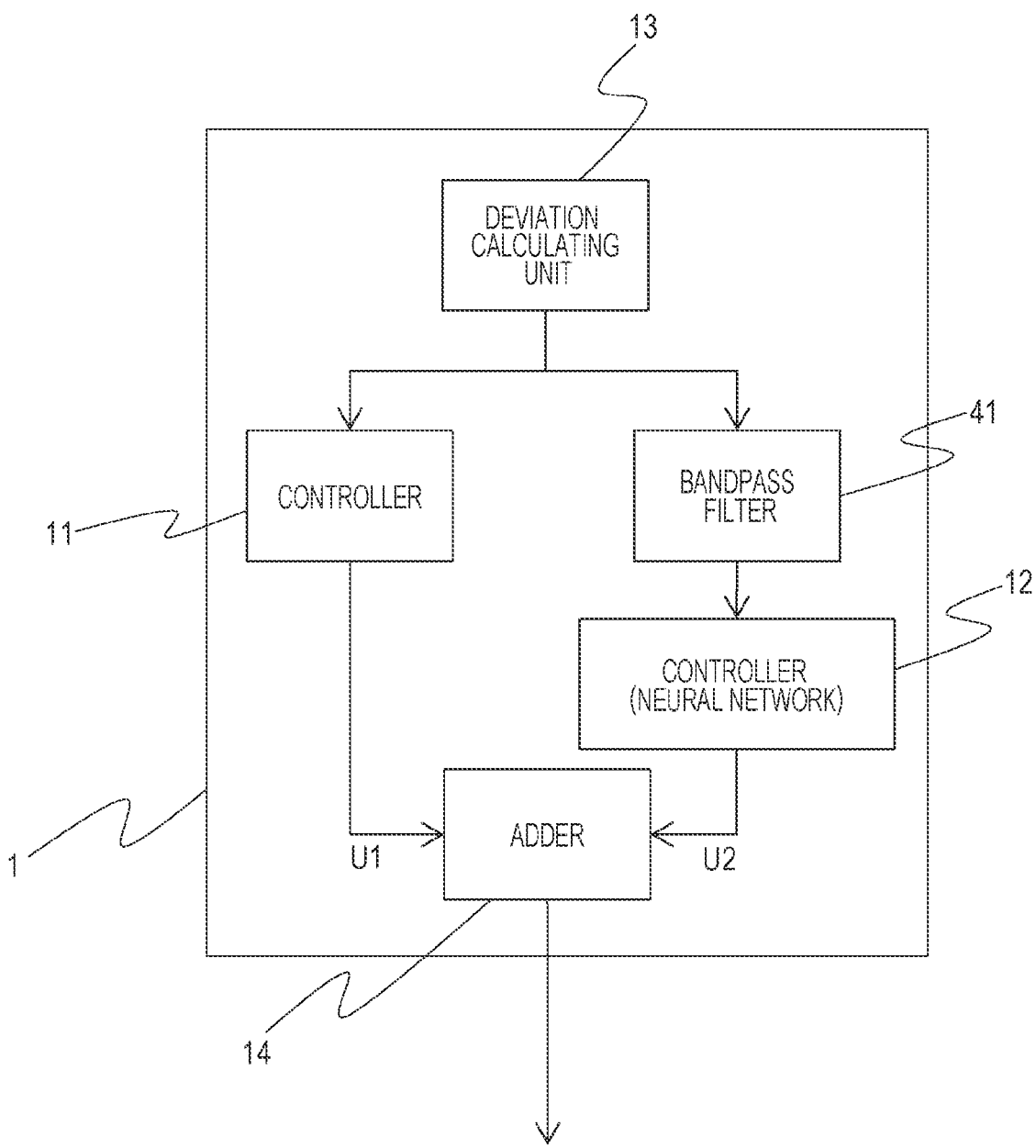
FIG. 5 is a schematic diagram of a control system according to a third embodiment.

Next, a third embodiment will be described using FIG. 5. FIG. 5 is a block diagram of the control unit 1. This control unit 1 is different from that of the first embodiment in the point that the stage deviation, which is the input of the controller 12, is subjected to a bandpass filter 41, which attenuates (stops) a certain band. A signal from the bandpass filter 41 is input to the learning control unit. A high-pass filter, a low-pass filter, a band-pass filter, or a notch filter may be used for the bandpass filter 41. Each filter may have a different stopband. For example, when the performance of the controller 12 drops as a result of a stage deviation at high frequencies, high frequencies of a band where the controller 12 operates may be attenuated using a low-pass filter. Similarly, a notch filter may be used when the control performance of the controller 12 drops as a result of a specific frequency range. If the performance of the controller 11 at low frequencies is sufficient, the controller 11 is responsible for low frequencies; thus, a high-pass filter may be used for the bandpass filter 41. A combination of these filters may be used. In addition, the bandpass filter 41 to be used may be changed (switched) according to the job of the imprint apparatus. In this case, because learning of the neural network is performed in accordance with the type of bandpass filter 41, control is performed by switching to parameters of the controller 12 corresponding to the bandpass filter 41. In short, the parameters of the controller 12 include a first parameter determined by machine learning using a deviation in a first band as input in the case where a first filter is used. In addition, the parameters also include a second parameter determined by machine learning using a deviation in a second band different from the first band as input in the case where a second filter is used.

Fourth Embodiment

Although a mold with a pattern portion is used for the imprint apparatus in the above-described embodiments, the above-described position control device is also applicable to a planarizing apparatus (molding apparatus) that molds resin on a substrate to planarize the resin using a mold without a pattern portion. For example, this is applicable to stage position control of a mold or a substrate.

In addition, the above-described position control device is applicable to an exposure apparatus that includes a forming unit that forms a pattern on a substrate by illuminating a mask and transferring the mask's pattern to the substrate using a projection optical system. For example, this is applicable to position control of a substrate stage or a mask stage.

Furthermore, the present technology is applicable to a measurement apparatus or a processing apparatus other than the imprint apparatus. The measurement apparatus includes the above-described position control device in order to control the position of a target object, and a measurement unit that measures the object whose position is controlled by the position control device. Examples of the measurement unit include a contact-type probe and a contactless interferometer. In addition, the processing apparatus includes the above-described position control device in order to control the position of a target object, and a processing unit that processes the object whose position is controlled by the position control device. Examples of the processing unit include a bite (cutting tool) and a laser.

Article Manufacturing Method

An article manufacturing method is suitable for manufacturing an article such as a micro-device including a semiconductor device, or an element with a micro-structure. The article manufacturing method of the present embodiment includes a step of forming a pattern using the above-mentioned imprint apparatus (imprinting method) on an imprinting material supplied (applied) to a substrate; and a step of processing the substrate on which the pattern is formed in the former step. Furthermore, the manufacturing method includes other conventional steps (such as oxidation, film formation, deposition, doping, planarization, etching, resist stripping, dicing, bonding, and packaging). The article manufacturing method of the present embodiment is advantageous in at least one of the performance, quality, productivity, and production cost of the article, compared with conventional methods.

Next, a method of manufacturing an article (such as a semiconductor IC element, a liquid crystal display element, a color filter, or a MEMS) using the above-described exposure apparatus will be described. The article is manufactured by: a step of exposing, using the above-described exposure apparatus, a substrate (such as a wafer or a glass substrate) coated with a photosensitive agent; a step of developing the substrate (photosensitive agent); and processing the developed substrate in other conventional processing steps. The other conventional steps include etching, resist stripping, dicing, bonding, and packaging. According to the present manufacturing method, an article whose quality is higher than conventional ones may be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A lithography apparatus comprising:
   a mask stage configured to hold and move a mask;
   a substrate stage configured to hold and move a substrate;
   a feedback control device configured to control the mask stage, the substrate stage or the both;
   wherein the lithography apparatus illuminates the mask and projects an image of the mask onto the substrate with the mask stage, the substrate stage or the both being controlled by the feedback control device,
   wherein the feedback control device is configured to take information regarding a control deviation between a measured value and a desired value of the mask stage, the substrate stage or the both as input, and output a feedback manipulated variable for the mask stage, the substrate stage or the both,
   wherein the feedback control device comprising:
   a processor configured to:
   obtain information regarding the control deviation as input and generate a first manipulated variable for the mask stage, the substrate stage or the both;
   input information regarding the control deviation to machine learning and to generate a second manipulated variable based on a parameter determined by the machine learning;
   switch on/off input of the second manipulated variable to the mask stage, the substrate stage or the both being controlled by the feedback control device; and
   add the first manipulated variable and the second manipulated variable into a feedback manipulated variable when the switching turns on; and
   control the mask stage, the substrate stage or the both based on the feedback manipulated variable.

2. A lithography apparatus comprising:
   a substrate stage configured to hold and move a substrate;
   a feedback control device configured to control the substrate stage;
   wherein the lithography apparatus forms a pattern on the substrate with the substrate stage being controlled by the feedback control device,
   wherein the feedback control device is configured to take information regarding a control deviation between a measured value and a desired value of the substrate stage as input, and output a feedback manipulated variable for the substrate stage,
   wherein the feedback control device comprising:
   a processor configured to:
   obtain information regarding the control deviation as input and generate a first manipulated variable for the substrate stage;
   input information regarding the control deviation to machine learning and to generate a second manipulated variable based on a parameter determined by the machine learning;
   switch on/off input of the second manipulated variable to the substrate stage; and
   add the first manipulated variable and the second manipulated variable into a feedback manipulated variable when the switching turns on; and
   control the substrate stage based on the feedback manipulated variable.

3. The lithography apparatus according to claim 1, wherein the processor is configured to determine whether the control deviation is within a tolerance, and turn the switching off in a case where it is determined that the control deviation is not within the tolerance.

4. The lithography apparatus according to claim 1, wherein the processor is configured to turn the switching on/off according to a type of job performed on the controlled object.

5. The lithography apparatus according to claim 1, wherein the machine learning is performed after turning the switching off.

6. The lithography apparatus according to claim 1, further comprising:
   a display configured to display a selecting unit for selecting on/off of the switching.

7. An article manufacturing method comprising:
   a step of forming a pattern on a substrate using the lithography apparatus;
   a step of processing the substrate on which the pattern is formed; and
   manufacturing an article from the processed substrate,
   wherein the lithography apparatus comprising:
   a mask stage configured to hold and move a mask;
   a substrate stage configured to hold and move a substrate;
   a feedback control device configured to control the mask stage, the substrate stage or the both;
   wherein the lithography apparatus illuminates the mask and projects an image of the mask onto the substrate with the mask stage, the substrate stage or the both being controlled by the feedback control device,
   wherein the feedback control device is configured to take information regarding a control deviation between a measured value and a desired value of the mask stage, the substrate stage or the both as input, and output a feedback manipulated variable for the mask stage, the substrate stage or the both,
   wherein the feedback control device comprising:
   a processor configured to:
   obtain information regarding the control deviation as input and generate a first manipulated variable for the mask stage, the substrate stage or the both;
   input information regarding the control deviation to machine learning and to generate a second manipulated variable based on a parameter determined by the machine learning;
   switch on/off input of the second manipulated variable to the mask stage, the substrate stage or the both being controlled by the feedback control device; and
   add the first manipulated variable and the second manipulated variable into a feedback manipulated variable when the switching turns on; and
   control the mask stage, the substrate stage or the both based on the feedback manipulated variable.

8. An article manufacturing method comprising:
   a step of forming a pattern on a substrate using the lithography apparatus;
   a step of processing the substrate on which the pattern is formed; and
   manufacturing an article from the processed substrate,
   wherein the lithography apparatus comprising:
   a substrate stage configured to hold and move a substrate;

a feedback control device configured to control the substrate stage;

wherein the lithography apparatus forms a pattern on the substrate with the substrate stage being controlled by the feedback control device, wherein the feedback control device is configured to take information regarding a control deviation between a measured value and a desired value of the substrate stage as input, and output a feedback manipulated variable for the substrate stage, wherein the feedback control device comprising:

a processor configured to:

obtain information regarding the control deviation as input and generate a first manipulated variable for the substrate stage;

input information regarding the control deviation to machine learning and to generate a second manipulated variable based on a parameter determined by the machine learning;

switch on/off input of the second manipulated variable to the substrate stage; and add the first manipulated variable and the second manipulated variable into a feedback manipulated variable when the switching turns on; and control the substrate stage based on the feedback manipulated variable.

9. A feedback control device that takes information regarding a control deviation between a measured value and a desired value of an object as input, and outputs a feedback manipulated variable for the object, comprising:

a processor configured to:

obtain information regarding the control deviation as input and generate a first manipulated variable for the object;

input information regarding the control deviation to machine learning and to generate a second manipulated variable based on a parameter determined by the machine learning;

switch on/off input of the second manipulated variable to the controlled object; and add the first manipulated variable and the second manipulated variable into a feedback manipulated variable when the switching turns on; and control the object based on the feedback manipulated variable.

* * * * *